United States Patent
Ziger et al.

(10) Patent No.: US 6,287,972 B1
(45) Date of Patent: Sep. 11, 2001

(54) SYSTEM AND METHOD FOR RESIDUE ENTRAPMENT UTILIZING A POLISH AND SACRIFICIAL FILL FOR SEMICONDUCTOR FABRICATION

(75) Inventors: David Ziger; Hunter Brugge, both of San Antonio, TX (US)

(73) Assignee: Philips Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 09/262,439

(22) Filed: Mar. 4, 1999

(51) Int. Cl.[7] .................................................. H01L 21/302
(52) U.S. Cl. ......................... 438/693; 438/694; 438/700; 438/756; 134/1.3; 216/51; 216/89; 216/97
(58) Field of Search ................................... 430/5; 134/1.3; 216/89, 97, 51; 438/693, 694, 700, 756, 942, 725

(56) References Cited

U.S. PATENT DOCUMENTS

| | | |
|---|---|---|
| 5,104,482 | 4/1992 | Monkowski . |
| 5,486,265 | 1/1996 | Salugsugan . |
| 5,540,811 | 7/1996 | Morita . |
| 5,616,069 | 4/1997 | Walker et al. . |
| 5,630,904 * | 5/1997 | Aoyama et al. ...................... 438/669 |
| 5,691,215 * | 11/1997 | Dai et al. ............................... 437/44 |
| 5,705,430 * | 1/1998 | Avanzins et al. ..................... 437/195 |
| 5,718,618 | 2/1998 | Guckel et al. . |
| 5,792,672 | 8/1998 | Chan et al. . |
| 5,816,891 | 10/1998 | Woo . |
| 5,852,497 | 12/1998 | Pramanik et al. . |
| 5,885,900 | 3/1999 | Schwartz . |
| 6,010,962 * | 1/2000 | Lin et al. ............................. 438/687 |

FOREIGN PATENT DOCUMENTS 10-172942 * 6/1998 (JP) .

OTHER PUBLICATIONS

Jacques S. Mercier; Rapid Flow of Doped Glasses for VLSIC Facrication; Solid State Technology, Jul. 1987.

* cited by examiner

Primary Examiner—Gregory Mills
Assistant Examiner—George Goudreau
(74) Attorney, Agent, or Firm—Oppenheimer Wolff & Donnelly, LLP (57) ABSTRACT

Chemical Mechanical Processing (CMP) is widely used for manufacturing semiconductors. CMP is very effective for planarizing geometry that are not widely isolated. One limiting aspect of CMP is that the deposition of the layer being planarized generally has an effective distance over which gaps can be filled. These gaps can fill with a residue that adversely effects the resultant semiconductor. A technique that inhibits the accumulation of residue deposits a sacrificial layer of material after deposition of a planarizing layer, but before CMP. This layer is selected so that it fills the gaps from the manufacturing process, but has little abrasive or solvent resistance. CMP is performed after the sacrificial layer is performed. However, since the gaps are filled, residues cannot collect. Then, after the CMP is performed, the sacrificial layer is removed by applying a solvent to the sacrificial layer. The choice of material for the sacrificial layer is also important. The sacrificial material must fill the gaps yet be very soluble for removal after the CMP processing is performed. A sacrificial layer having a low viscosity novalac polymer has excellent characteristics for a sacrificial layer. The sacrificial layer will ideally adequately fill spaces and have no abrasive resistance. The sacrificial layer must have adequate compressive strength and be slick enough, like glass, to prevent CMP residue from collecting on the fill areas.

14 Claims, 9 Drawing Sheets

SYSTEM AND METHOD FOR RESIDUE ENTRAPMENT UTILIZING A POLISH AND SACRIFICIAL FILL FOR SEMICONDUCTOR FABRICATION

FIELD OF THE INVENTION

The present invention relates to a method for chip fabrication and more particularly to a method that utilizes a sacrificial fill layer to eliminate residues from polishing having a detrimental effect on the quality of the finished product.

BACKGROUND OF THE INVENTION

Chip fabrication involves the utilization of many processes that remove various layers from the silicon or other chip substrate. For example, an organic film, such as a resist or polyamide film temporarily formed on a substrate, which is a part of a semiconductor device, as a part of the process of fabricating the semiconductor device has in the past been removed by an ashing method using, for example an oxygen plasma. Removing the resist film is an important part of the process of fabricating a semiconductor device. Since the semiconductor industry is very small as compared to a Large Scale Integrated circuit device (LSI) or a Very Large Scale Integrated circuit device (VLSI) in which it is used, the resist film, which will be referred to as "resist" hereinafter, is hard to remove without damaging the device. Moreover, current chip fabrication requires extremely small size, so the feature size control is extremely tight. Thus, to avoid the infiltration of a particulate from chip processing, such as the ashing process, a technique is necessary to prevent the accumulation of a particulate in the resultant product.

U.S. Pat. No 5,104,482 discusses a glass deposition viscoelastic flow process for forming planar and semi-planar flow process for forming planar and semi-planar insulator structures on semiconductor devices, which comprises feeding vaporized reactants into a reaction chamber at a reaction temperature between 750 and 950 degrees Centigrade and subjecting the surface of the semiconductor devices to a high reactant velocity. The high reactant velocity allows the formation of a high quality, uniform glass layer at temperatures compatible with the fusion temperature, so that deposition occurs simultaneously with the viscoelastic flow of the glass. The simultaneous deposition and flow provides for topographical planarization substantially free of voids and other layer inconsistencies.

Other examples of current methods for manufacturing semiconductor devices include U.S. Pat. No. 5,540,811 to Toshiba which discloses a technique for providing a combination of layers of materials that have various properties that facilitate precise planarization of the substrate surfaces. In addition, on the basis of combinations of the selection of the polishing speed of the burying material and the optimization of the film thickness, it is possible to omit the processes of forming the block resist, the planarization resist and the etching process before polishing to simplify a manufacturing process. However, as with the aforedescribed plasma ashing process, the tolerances that this manufacturing technique provide are not adequate for modem VLSI devices.

Improved methods for manufacturing semiconductor devices have recently been developed, such as a photoresist strip method detailed in U.S. Pat. No. 5,792,672 to Chartered Semiconductor Manufacturing Ltd. The technique utilizes a two step process, in which a first stripping step is in a plasma containing oxygen and water, and a second stripping step is in a plasma containing oxygen.

Moreover, in a typical manufacturing process a large wafer of silicon, germanium or similar material in extremely pure crystalline form is overlayed sequentially with numerous layers of material which function as conductors, semiconductors or insulators. Each subsequent layer is deposited and patterned usually by photolithographic techniques such that the sequence of layers forms a complex array of electronic circuitry. However, the multiple layers can be formed only with difffficulty unless the substrate topography is planarized in an early stage of the manufacturing process and then maintained as closely as possible to a planar surface throughout subsequent layer depositions.

Generally, each device on the wafer is much smaller than the wafer itself. Once the wafer has been manufactured, one of the final steps in the manufacturing sequence is to cut the wafer into along predetermined scribe lines to many individual devices which are commonly referred to as "chips." However, because the chips are so small and their circuitry is so complex, almost any flaw or irregularity in a layer can disrupt the circuit patterns and render a given chip useless. Indeed it is fairly common for a substantial percentage of the chips on a wafer to be found defective upon testing. For example, using a prior art technique of film deposition followed by thermal fusion flow to planarize a glass layer can cause voids or other layer inconsistencies.

Thermal fusion flow, used as a generic term for glass flow or reflow is generally performed on the pre-metal dielectric passivation layers used in typical metal-oxide semiconductor (MOS) fabrication sequences. The flow is used to densify the glass layer and prepare it for a subsequent contact hole etch, and at the same time to improve its step coverage properties. The topography-smoothing measure is entended to ensure the continuity of the overlaying metallization as disclosed in Mercier, Rapid Flow of Doped Glasses for VLSIC Processing, Solid State Technology Vol. 30, No. 7, 85 (1987).

Although the use of a thermal fusion flow process is common in the prior art to obtain smooth or planarized successive layers, the likelihood of voids and other inconsistencies in the layers and the temperatures necessary to achieve the flow can foreclose the application of the thermal fusion flow process to heat sensitive VLSI devices.

The conventional method for BPSG processing consists of formation of the glass layer by Chemical Vapor Deposition (CVD). CVD processes operate on the basis of two surface reaction steps. First, one or more reactive gases, from which the compound or elements to be deposited will be obtained, are passed over the surface of the wafer under reaction conditions at which the wafer surface will catalyze the liberation of the deposited materials. In some cases the reactive gas will be introduced directly into the reactor, while in others it will be formed "in situ" in the gas space in the reactor by reaction from other introduced gases.

Ideally, it would be advantageous to have a deposition/planarization process that would create and deposit a glass film of varying composition by CVD and simultaneously with the deposition flow the layer as to completely fill, without voids, all spaces and trenches between the micron and sub-micron pattern features. This approach would eliminate the difficult requirement of substantially perfect conformality that must be attained by other methods of film deposition if planarization is to be accomplished to avoid the infiltration of a particulate.

Chemical Mechanical Processing (CMP) is widely used for manufacturing semiconductors. CMP is very effective for planarizing geometries that are not widely isolated. CMP processes planarize the surface of semiconductor wafers to a desired thickness. In a typical CMP process, a wafer attached to a carrier is pressed against a polishing pad in the presence of a slurry. The slurry contains abrasive particles that mechanically remove material from the wafer and chemicals that chemically treat the material that is ultimately polished. Waste material eventually accumulates on the planarizing surface of the polishing pad during planarization which diminishes the pads effectiveness. The waste matter on the pad reduces the effectiveness and the uniformity of the planarizing surface of the polishing pad. The waste matter accordingly reduces throughput of the CMP process and the uniformity of the polished surface on the wafer. Accordingly, it is necessary to periodically clean the planarizing surface of a polishing pad. Planarizing surfaces of polishing pads are conventionally cleaned by brushing the pad with a stiff brush, but U.S. Pat. No. 5,616,069 teaches a method of using a pad scrubber to clean the planarizing surface of a polishing pad used in CMP processing of semiconductor wafers. The pad scrubber has a fluid manifold and a plurality of nozzles coupled to the manifold to clean the pad as it is used in the CMP process. U.S. Pat. No. 5,816,891 discloses a method and apparatus for performing chemical mechanical polishing of oxides and metals using sequential removal on multiple polish platens to increase equipment throughput. U.S. Pat. No. 5,852,497 to the common assignee of this patent application discusses Shallow Trench Isolation (STI) for semiconductor manufacture wherein chemical mechanical polishing (CMP) is utilized to planarize the topography of the alignment marks. Because the polysilicon layer is opaque to the conventional white light source and the HeNe source, and because the alignment marks have been planarized, boundaries between different materials are used to form the alignment marks.

The present invention addresses the limitations of conventional CMP technology in achieving uniformly planarized surfaces of materials, particularly dielectric materials, at high removal rates. The inability of conventional CMP technology to achieve high polishing rates constitutes a serious economic impediment. Time consuming CMP decreases production throughput, consumes man hours and exhausts large amounts of cleaning agent and other consumable materials. The lack of a uniformly planarized surface adversely affects the reliability of the resulting semiconductor device, particularly in devices comprising multi-level vias wherein the upper vias would be overetched to insure complete etching at the lower levels.

U.S. Pat. No. 5,486,265 addresses and solves such limitations of conventional CMP technology, i.e., methodology and apparatus, by selecting an appropriate initial pressure applied to wafer undergoing CMP and intermittently reducing the initial pressure to a second pressure a plurality of times during the course of CMP processing. During the course of CMP processing, the surface to be polished in contact with the polishing pad becomes depleted in cleaning agent, which adversely affects the polishing rate and uniformity of the CMP operation, since incomplete polishing occurs in depleted areas, as toward the center of the wafer. By varying the pressure applied to the wafer undergoing CMP is intermittently reduced creating a pulsing pressure, thereby enabling the cleaning agent, which is normally continuously applied to the polishing pad, to continuously reach all portions of the surface of the wafer undergoing polishing throughout the entire CMP operation. Thus, the periodic reduction of pressure applied to the wafer during CMP processing eliminates the negative impact of starvation areas, i.e., areas which do not have a sufficient amount of cleaning agent. One limiting aspect of CMP is that the deposition of the layer being planarized generally has an effective distance over which gaps can be filled. These gaps can fill with a residue that adversely effects the resultant semiconductor.

SUMMARY OF THE INVENTION

According to a broad aspect of a preferred embodiment of the invention, a technique to minimize or eliminate the accumulation of CMP residues is disclosed. The technique deposits a sacrificial layer of material after deposition of a planarizing layer, but before CMP. This layer is selected so that it fills the gaps from the manufacturing process, but has little abrasive or solvent resistance. CMP is performed after the sacrificial layer is performed. However, since the gaps are filled, residues cannot collect. Then, after the CMP is performed, the sacrificial layer is removed by applying a solvent to the sacrificial layer. The choice of material for the sacrificial layer is also important. The sacrificial material must fill the gaps yet be very soluble for removal after the CMP processing is performed. A sacrificial layer having a low viscosity novalac polymer has excellent characteristics for a sacrificial layer. The sacrificial layer will ideally adequately fill spaces and have no abrasive resistance. The sacrificial layer must have adequate compressive strength and be slick enough, like glass, to prevent CMP residue from collecting on the fill areas.

DESCRIPTION OF THE DRAWINGS

The foregoing and other objects, aspects and advantages are better understood from the following detailed description of a preferred embodiment of the invention with reference to the drawings, in which.

DETAILED DESCRIPTION

The present invention relates generally to semiconductor processing, and, more particularly, to chemical mechanical processing and improving the throughput and quality of oxide and metal chemical mechanical polishing tools employed in semiconductor manufacture. Chemical Mechanical Polishing (CMP) is widely accepted for polishing semiconductor wafers. Both oxide CMP and metal CMP are used, respectively, on oxide and metal surfaces supported over a semiconductor substrate.

Oxide CMP is employed to convert a conformal oxide layer deposited on a layer of patterned metal, into a planar oxide surface. Without oxide CMP, the conformal oxide layer conforms to the shape of the layer of patterned metal. Fluctuations in the surface of the conformal oxide layer exist above metal steps in the layer of patterned metal. With oxide CMP, oxide on the surface of a wafer is removed, producing a planar layer of oxide above the metal steps. Accordingly, a second layer of metal deposited on the surface of the planar layer of oxide, will also have a planar surface. Metal CMP is employed to convert a conformal metal layer deposited on a layer of patterned oxide, into a planar metal/oxide surface. This planar metal/oxide surface then comprises metal structures surrounded by other materials. Local planarity corresponds to providing planarization over small regions of the wafer surface, while global planarity corresponds to providing planarization over the entire wafer surface.

The challenge involved with performing metal CMP is quite different than for oxide CMP. For oxide CMP, polishing stops on oxide and the goal is to achieve global and local planarity across the semiconductor wafer surface. For metal CMP, polishing stops partly on metal and partly on oxide. The goal is to achieve a planar surface on each of the metal structures which is flush with the surrounding field oxide regions.

Structure dishing or gouging, as well as the erosion of neighboring field oxide regions, is a major concern for metal CMP. Structure dishing, or metal dishing, is characterized by the recessed surface of the metal structures. Metal dishing results from elastic deformations of the polishing pad material. Erosion is caused by increased removal of oxide which results from the transfer of pressure to the oxide surface. The state of the art method of performing both oxide CMP as well as metal CMP involves polishing a wafer supported in a wafer-carrier head with a polishing pad mounted on a polishing platen. During polish, the wafer is caught between the wafer-carrier head and the polish pad. Both the wafer-carrier head and the polish table or polish platen rotate during polish.

Existing oxide CMP tools include tools that offer single wafer processing with a single wafer-carrier head, double wafer processing with dual wafer-carrier heads and multiple wafer processing with multiple wafer-carrier heads. Each process cycle can only process a wafer or set of wafers equivalent to the number of wafer-carrier heads on the tool. All existing oxide CMP tools are configured to process one wafer, two wafers, or multiple wafers using a single polish platen. Current state of the art oxide CMP tools can process one, two or up to five to six wafers simultaneously on a single polish platen. A large polish platen is employed to accommodate more than one wafer.

In accordance with the invention, a chemical mechanical polisher is provided with increased throughput. Chemical mechanical polishing of oxide is performed by sequential polishing using multiple polish platens and a single polish platen polishes a fraction of the total oxide removal target. (Total oxide removal target refers to the total amount of oxide to be removed from a wafer during one complete CMP process cycle.) Total oxide removal is achieved after completing polishing on all available polish platens assigned for polishing. The amount of oxide removed on each polish platen depends on the number of polish platens, slurry supply and polishing pad. Thus, both the polishing slurry and polishing pad material can be different for each polish platen. This degree of freedom adds tremendous manufacturing flexibility in metal CMP.

For metal CMP, the factors affecting polishing rate, non-uniformity, planarity, dishing of metal structures, erosion of field oxide, and finishing surface quality of metal and field oxide, are secondarily related to equipment parameter settings. Both polishing slurry and pad need to be compatible with the material to be polished in order to achieve the best results. Still another common use for metal CMP is to form tungsten plugs which serve as contacts and vias between two layers of aluminum metal. Slurry and polishing pad material can be substituted for each polish platen, which is especially important when dealing with aluminum, copper or other metals. Different polishing pads may be beneficial for metal CMP as a softer pad can be used in the first polish platen to allow fast removal of bulk metal material, and then a stiffer polishing pad can be used in the polishing process. It is well-known in the art of oxide CMP that oxide removal rate decreases with longer polish time and higher oxide removal, i.e., the amount of oxide removed. The oxide removal rate is highest on a freshly conditioned polish pad.

One of the basic problems in integrated circuit manufacturing is defects caused by the presence of particulates. For example, if photolithography with 0.8 micron minimum geometry is being performed to pattern a conductor layer, the presence of a 0.5 micron particle can narrow the patterned line enough to cause a defect which will prevent the circuit from operating (either immediately due to an open circuit, or eventually due to electromigration). For another example, if a 100 Angstrom particle of silicon adheres to the surface and is included in a 200 Angstrom nitride layer being grown, the dielectric will have greater chances of breaking down at that point, even assuming that no subsequent process step disturbs the silicon particle.

This problem is becoming more and more troublesome because of two trends in integrated circuit processing: First, as device dimensions become smaller and smaller, the size of a "killing defect" becomes smaller, so that it is necessary to avoid the presence of smaller and smaller particles. This makes the job of making sure that a clean room is really clean increasingly difficult. For example, a clean room which is Class 1 (i.e. has an atmosphere with less than one particle per cubic foot) for particles of one micron and larger may well be Class 1000 or worse if particle sizes down to 100 Angstroms are counted.

Second, there is an increased desire to use large size integrated circuits. For example, integrated circuit sizes larger than 50,000 square mils are much more commonly used now than they were five years ago. This means that each fatal defect is likely to destroy a larger area of processed wafer than was previously true. Another way to think of this is that not only has the critical defect size decreased, but the critical defect density has also decreased.

Thus, particulates are not only an extremely important source of loss in integrated circuit manufacturing yields, but their importance will increase very rapidly in the coming years. Thus, it is an object of the present invention to provide generally applicable methods for fabricating integrated circuits which reduce the sensitivity of the process to particulate contamination. One of the major sources of particulate contamination is human-generated, including both the particles which are released by human bodies and the particles which are stirred up by equipment operators moving around inside a semiconductor processing facility (front end). To reduce the potential for particulate contamination from this major source, the general trend in the industry has been to make more use of automatic transfer operations. Using such operations, for example, a cassette of wafers can be placed into a machine, and then the machine automatically transfers the wafers, one by one, from the cassette through the machine (to effect the processing steps necessary) and back to the cassette, without manual assistance.

However, efforts in the area of automatic transfer operations have served to highlight the importance of a second source of particles, namely particles generated by the wafers and the transfer mechanisms during handling and transport operations. When the surface of the wafer jostles slightly against any other hard surface, some particulate (of silicon, silicon dioxide, or other materials) is likely to be released. The particulate density inside a conventional wafer carrier is typically quite high, due to this source of particulate. Moreover, many of the prior art mechanisms for wafer transport generate substantial quantities of particulate. The general problem is discussed in U.S. Pat. Nos. 4,439,243 and 4,439,244, which are incorporated by reference hereinto.

Some types of wafer processing are shown in U.S. Pat. No. 4,293,249 by Whelan issued on Oct. 6, 1981, U.S. Pat. No. 4,306,292 by Head issued on Dec. 15, 1981, and U.S. Pat. No. 3,765,763 by Nygaard issued on Oct. 16, 1973, which are incorporated by reference hereinto. The prior applications discussed above addressed this facet of the problem by providing a vacuum wafer carrier in which particulate generation due to abrasion of the surface of the wafer during transport is reduced. The teachings of these prior applications enabled not only reduced generation of particulate in the carrier during transport and storage, but also reduced transport of particulate to the wafer's active face during transport and storage by carrying the wafers face down under a high vacuum. This allowed the rapid settling of both ambient and transport generated particulate on other than the active wafer face. The wafers can therefore be transported, loaded, unloaded and processed without ever seeing atmospheric or even low vacuum conditions. This is extremely useful, because, at pressures of less than about 10<-5> Torr, there will not be enough Brownian motion to support particles of sizes larger than about 100 Angstrom, and these particles will fall out of this low-pressure atmosphere relatively rapidly.

Note that, at a pressure of 10<-5> Torr or less, even 100 Angstrom particles will fall one meter per second, and larger particles will fall faster. (Large particles will simply fall ballistically, at the acceleration of gravity.) Thus, an atmosphere with a pressure below 10<-5> Torr means that particles one hundred angstroms or larger can only be transported ballistically, and are not likely to be transported onto the critical wafer surface by random air currents or Brownian drift.

The various process modules disclosed herein provide a tremendous improvement in the modularity of processing equipment. That is, a reactor can be changed to any one of a very wide variety of functions by a relatively simple replacement. It may be seen from the detailed descriptions below that most of the different functions available can be installed merely by making replacements in the wafer susceptor and related structures-i.e. in the top piece of the reactor, which bolts on-or in the feed structures, i.e. the structures directly below the wafer. Thus, the basic configuration of the vacuum chamber and wafer transfer interface is changed very little. However, this configuration does not address the protection from the polishing that is a critical dimension in accordance with a preferred embodiment.

A preferred embodiment in accordance with the invention utilizes a viscoelastic process that forms a substantially planarized glass layer on a semiconductor device to shield the semiconductor fabrication from infiltration by unwanted particulate. The process provides for the combined deposition, simultaneous viscoelastic flow of a glass layer substantially free from voids or other layer inconsistencies and allowing the removal of the layer once the polishing process has been completed utilizing any of a plurality of solvents.

After a wafer has received an initial layer without a viscoelastic flow, such as an undoped oxide layer, a silicon nitride or other functionally equivalent dielectric layer in which the layer is deposited such that the topographical features are not completely filled, then a second sacrificial layer is deposited utilizing in accordance with a preferred embodiment, a viscoelastic flow process to fill the spaces and trenches. Then polishing of the chip occurs and the resultant finished product is etched to remove all or some of the sacrificial layer and any residue that may have accumulated from the processing on or in the sacrificial layer.

This approach eliminates the difficult requirement of substantially perfect conformity that must be attained to accomplish topographical planarization resulting in higher device yield and reliability in the resultant chip fabrication. The viscoelastic flow process comprises an integrated dual process for glass deposition and simultaneous flowing of the material onto a wafer substrate. In accordance with a preferred embodiment, the process utilizes an organic silicon compound; triethylborate (TEB), an organic silicon compound; triethylphosphate (TEPO), an organic phosphorus compound; a gaseous oxidant and inert diluent gas. While the preferred embodiment is descriptive of organic compounds, the use of conventional, inorganic hydrides and organometallic compounds or a combination of inorganic hydrides and organic reactants would be within the spirit and scope of the present invention. Although an inert diluent gas, either argon or nitrogen is a preferred gas, the present invention can be practiced using ozone or nitrous oxide as a gaseous oxidant.

In the preferred embodiment, a liquid reactant mixture of TEOS, TEB and TEPO is transferred as a vapor mixture, preferably generated in a vaporizer unit of the CVD reactor. In the preferred embodiment, the deposition process is carried out in a vaporizer unit of the CVD reactor allowing a high velocity luminar flow. The high reactant velocity maximizes the desirable heterogeneous, surface-controlled reaction while the homogeneous, particle generating process is minimized. Measured volumes of the liquid reactants are injected into the vaporizer to generate the quantity of reactant vapor necessary for the CVD reaction. The pressure and temperature of the vaporizer are chosen to completely vaporize all of the liquid reactants without inducing thermal decomposition or other changes of the reactants. In the preferred embodiment, the vaporization temperatures are in the range of 150 to 275 degrees C., while the CVD reactor system pressure is in the range of 0.5 to 100 torr. However, the system pressure can vary beyond the range of the preferred embodiment and still be within the scope and spirit of the claims.

In the simultaneous deposition and thermal fusion flow, the glass is densified, creating a glass containing dopants which ultimately lowers the temperature required to flow the glass and increasing the degree of fusion. Once this sacrificial layer is deposited, CMP polishing can occur without concern for particulate formation. Then, a wet or dry etch is performed to remove the sacrificial layer as a final process step.

Removing the resist film is an important part of the process of fabricating a semiconductor device. Since the semiconductor industry is very small as compared to a Large Scale Integrated circuit device (LSI) or a Very Large Scale Integrated circuit device (VLSI) in which it is used, the resist film, which will be referred to as "resist" hereinafter, is hard to remove without damaging the device. Moreover, current chip fabrication requires extremely small size, so the feature size control is extremely tight. Thus, to facilitate a tight level of control of dimensions, there must be minimal deviation from the average critical dimension. This has heretofore not been accomplished.

A layer, called simply a "ground layer" hereinafter, upon which the resist is formed, is usually formed from a material, such as silicon dioxide ($SiO_2$), polysilicon (Si) or aluminum (Al). Generally, the resist is not easily etched by an ashing method. In other words, the resist is hard to etch precisely without damaging the ground layer in the etching process. Therefore, when an ashing method is used in the process of fabricating LSIs or VLSIs, great attention must be paid to leaving the ground layer as it is, because the ground layer of the LSI or the VLSI is very thin and not even a small part of it can be permitted to be etched.

There are many kinds of plasma ashing methods for removing a resist film which have been provided on an insulating layer in a semiconductor. The most widely used is a down-flow ashing method because, applying the down-flow ashing method to the plasma ashing process, damage caused by charged particles can be avoided. The down-flow ashing rate generally depends on the temperature, which will hereinafter be called the "ashing temperature," of the resist, such that the ashing rate decreases with a decrease in the ashing temperature. The ashing rate is usually expressed by the well known Arrhenius plot by which the ashing rates are plotted in a line against the inverse numbers of the respective ashing temperature. In the Arrhenius plot, the gradient of the line provides the activation energy for ashing such that, when the ashing rate decreases rapidly with the decrease of the ashing temperature, the activation energy is large, and such that, when the ashing rate changes only slightly with the decrease of the ashing temperature, the activation energy is small. In this process, a small activation energy is desirable because ashing can then be performed virtually independent of the ashing temperature. In other words, where the activation energy is small, ashing can be performed in a stable and precise manner.

Recently, there has been a tendency to use a process for fabricating semiconductor devices performed at lower temperatures, in accordance with a trend of miniaturization of devices as in the LSI or VLSI circuits. It is desirable to perform the ashing process at a temperature lower than three hundred degrees Celsius, most preferably below two hundred degrees Celsius to avoid contamination from the resist. In order to maintain a high ashing rate at such low temperatures, the activation energy of the ashing rate must also be low. The activation energy of the ashing rate can be changed to some extent by changing the particular reactant gasses used for ashing. The selection of the reactant gases, and particularly the use of combinations of such gases, is very important in order to provide high rates and low activation energies, and to precisely etch the resist, while leaving the ground layer as unchanged as possible and for minimizing damage.

Downflow ashing is performed in a downflow of microwave plasma using a microwave plasma resist stripper. This technique is detailed in a paper entitled, "Heavy Metal Contamination From Resists during Plasma Stripping," by Shuzo Fujimara and Hiroshi Yano, in Elect. Chem. Soc. Col. 135, No. 5, May 1988.

Another method that could be utilized in accordance with a preferred embodiment for removing a used organic resist in a downstream ashing apparatus on a silicon semiconductor wafer utilizes a technique in which water vapor is added to an oxygen plasma gas generated by microwaves. The addition of the water vapor lowers an activation energy of the ashing reaction and increases the reactive species generated in the plasma. Accordingly, the ashing rate is increased even at a relatively low, wafer processing temperature of one-hundred fifty degrees Celsius. The addition of the water vapor increases the ashing rate for a wide range of the percentage of the water content, providing easier control of the process.

The etching process in accordance with a preferred embodiment can be facilitated by coating a wafer with a photoresist, such as an ultraviolet (UV) photosensitive organic material, heating the photoresist to a temperature of between one hundred to two hundred degrees Celsius to drive off solvents, exposing the photoresist to a mask, developing the resist and etching the exposed resist to leave certain areas on the water surface exposed. Further processing steps, such as deposition, implantation or etching can then be utilized on the exposed areas. After these subsequent processing steps are performed, then the photoresist is stripped.

To strip the photoresist, there are wet treatment methods in which chemicals, such as hydrogen peroxide or organic solvents are used; and dry treatment methods in which the photoresist film is ashed using a plasma. In the wet treatment method, attention must be paid to safety, since impurities can adhere to the substrate this method is not suitable to fine fabrication of VLSI circuits. In the dry treatment method, a photoresist film is removed by causing it to react with oxygen radicals generated in the oxygen plasma thereby decomposing it and evaporating it into carbon dioxide, nitrous oxide and water. These methods do not have the same problem of safety and adhesion of impurities and are suitable for fine fabrication of the substrate. However, the substrate and the photoresist film typically must be heated to react with the radicals.

The etching process in accordance with a preferred embodiment permits the effective etch removal of selected portions of metal containing film material from a substrate. In the plasma-assisted dry etching process of the invention for etch removal, the metal-coated surface is exposed to a plasma which is effective in etching the away a metal film. Contemporaneously, the surface is contacted with the etch enhancing reactant, which interacts with the film on the substrate to enhance the etch removal of the film.

Figure 1A:
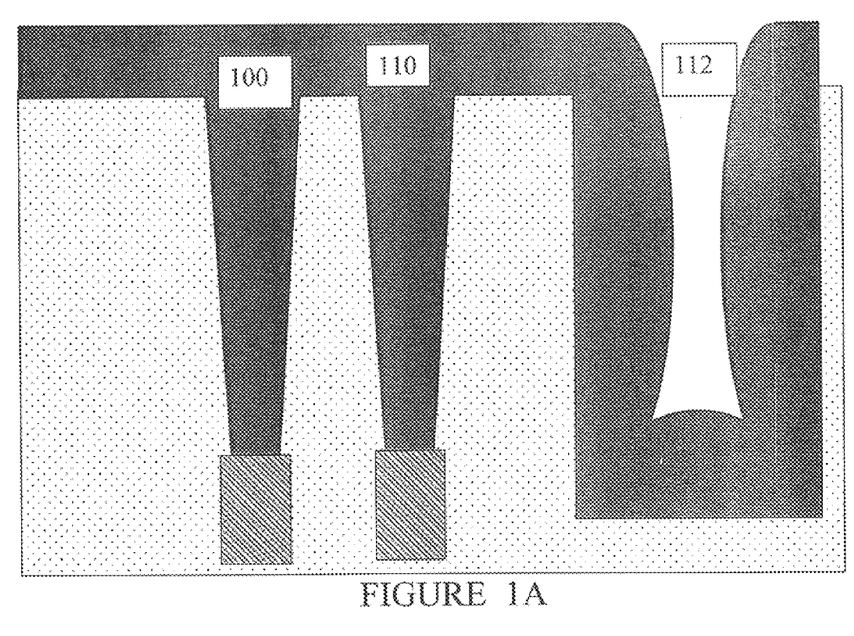
FIG. 1a is a schematic of a film before Chemical Mechanical Polishing (CMP) in accordance with a preferred embodiment.
Figure 1B:
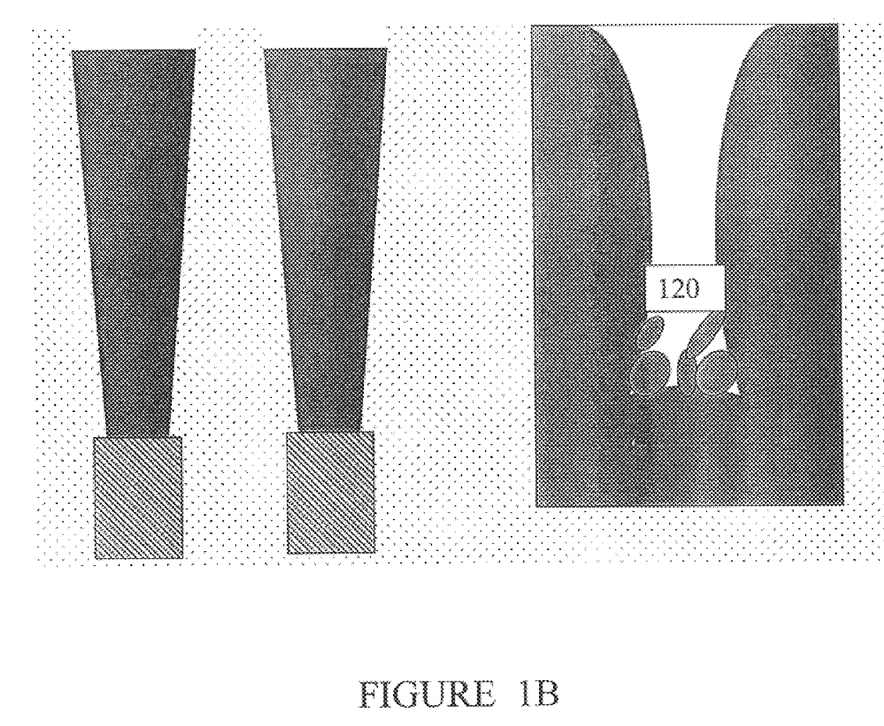
FIG. 1b is a schematic of a film showing the residue that may accumulate.

Chemical Mechanical Polishing (CMP) is a widely used technique for manufacturing semiconductors. CMP is very effective for planarizing geometry that are not widely isolated. One limitation of CMP is that the deposition of the layer being planarized generally has an effective distance over which gaps result. These gaps can fill with particulate resulting from the polishing process. FIG. 1a illustrates a schematic of a film before CMP. The two spaces that were filled 100 and 110 are design size contacts or vias while the larger feature illustrates, for example, a stepper alignment artifact 112 gap that is much larger than the design minimum. While the deposition fills contacts, it does not completely fill the gap between larger features. If the structure in FIG. 1a is polished, then CMP will leave residues 120 in the unfilled areas as illustrated in FIG. 1b. These residues are difficult to remove without damaging the semiconductor.

Figure 2A:
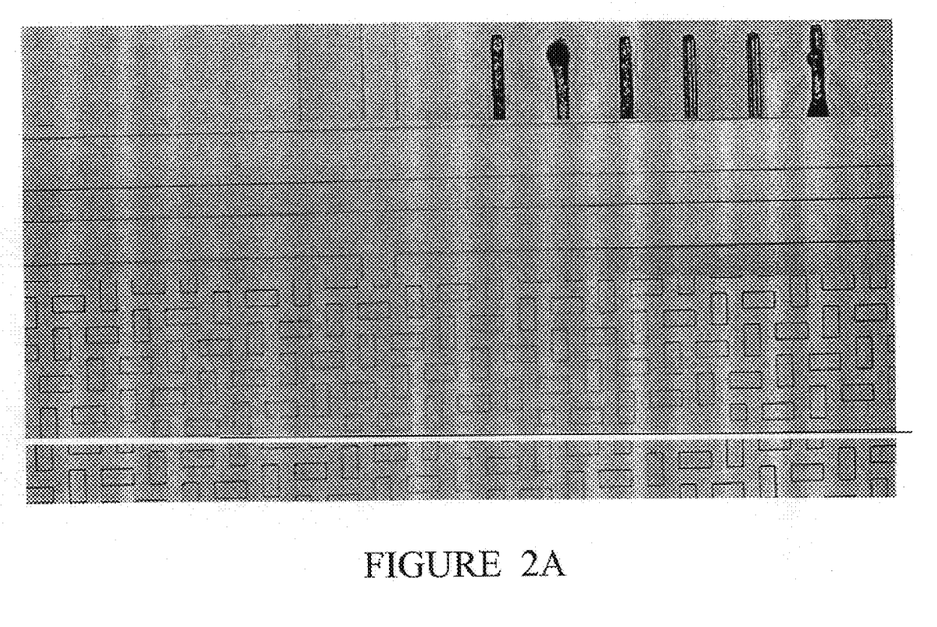
FIGS. 2a and 2b illustrate a photograph and SEM cross section of a stepper alignment mark filled with a CMP residue in accordance with a preferred embodiment.
Figure 2B:
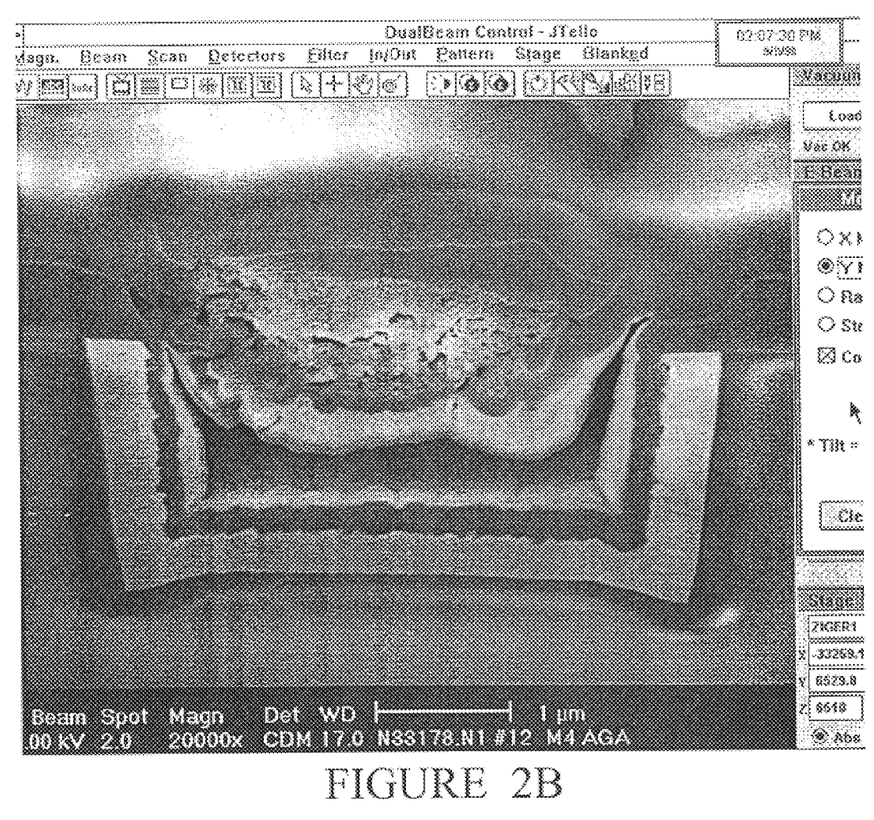

FIGS. 2a and 2b illustrate a photograph and SEM cross-section of a stepper alignment mask that was filled with CMP residue distorting the circuit pattern. In the case of the stepper alignment marks, the goal is not to completely planarize marks at metal levels. To successfully integrate CMP into the manufacturing process, care must be taken to provide sufficient contrast or topography of the lithographic alignment targets to permit accurate detection or capture of these features. Therefore, it is common practice to construct alignment features wide enough so they are not completely filled prior to CMP. It is desirable that these features are not distorted due to polish residues collecting in these alignment structures.

A preferred embodiment in accordance with the present invention utilizes a method for minimizing or eliminating accumulation of CMP residues. After deposition of the planarizing layer, but before CMP, a sacrificial layer is deposited by spinning or other means as described above. This layer is intentionally chosen so that it fills the gaps but has little abrasion or solvent resistance. After putting on the sacrificial layer, CMP is performed. However, since the gaps are filled, residues cannot collect. After the polishing is completed, the sacrificial layer can be removed utilizing a solvent or other means as described above.

The choice of material for the sacrificial layer is critical. It must fill gaps, yet be very soluble for post CMP removal. While one choice is described above in accordance with a preferred embodiment, key features of the layers include low viscosity novalac polymers such as that the material utilized as a backbone in I-line photoresists. The material must adequately fill spaces by spin coating and must have little to no abrasive resistance. Moreover, it must also have adequate strength and a slippery, glassy surface to prevent CMP residue from collecting in the filled areas. After CMP, a novalac resist is very soluble in base, so it will dissolve readily in TMAH or other strong base. Another choice would be partially cured spin on glass or even silicon aerogels. Both of these materials would readily dissolve in a dilute HF solution.

Figure 3A:
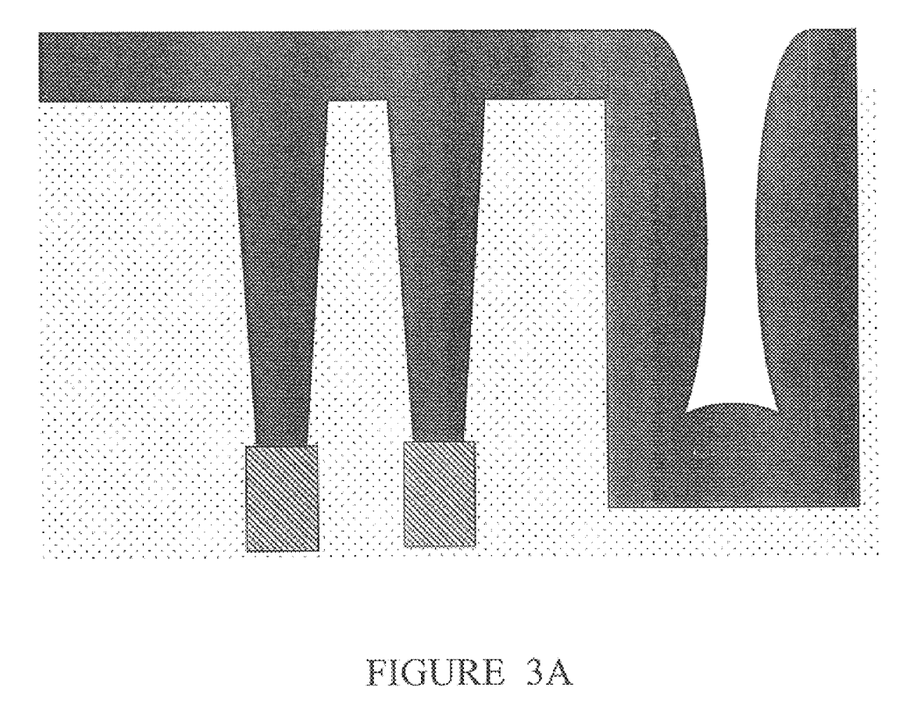
FIG. 3a illustrates a schematic of a semiconductor manufacture with tungsten coating the sides of the groves in accordance with a preferred embodiment.
Figure 3B:
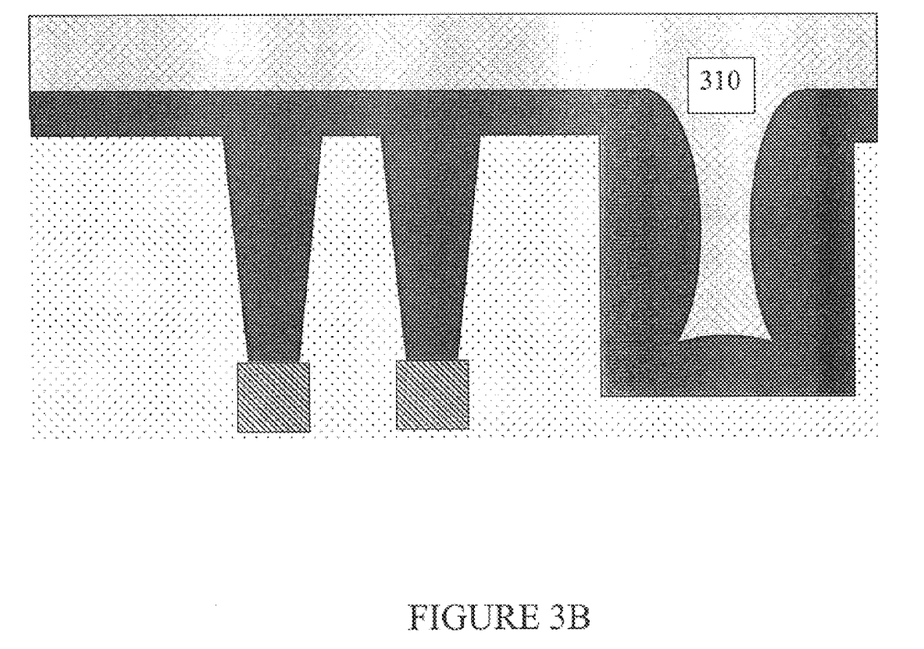
FIG. 3b illustrates a filling agent coating of a wafer in accordance with a preferred embodiment.
Figure 3C:
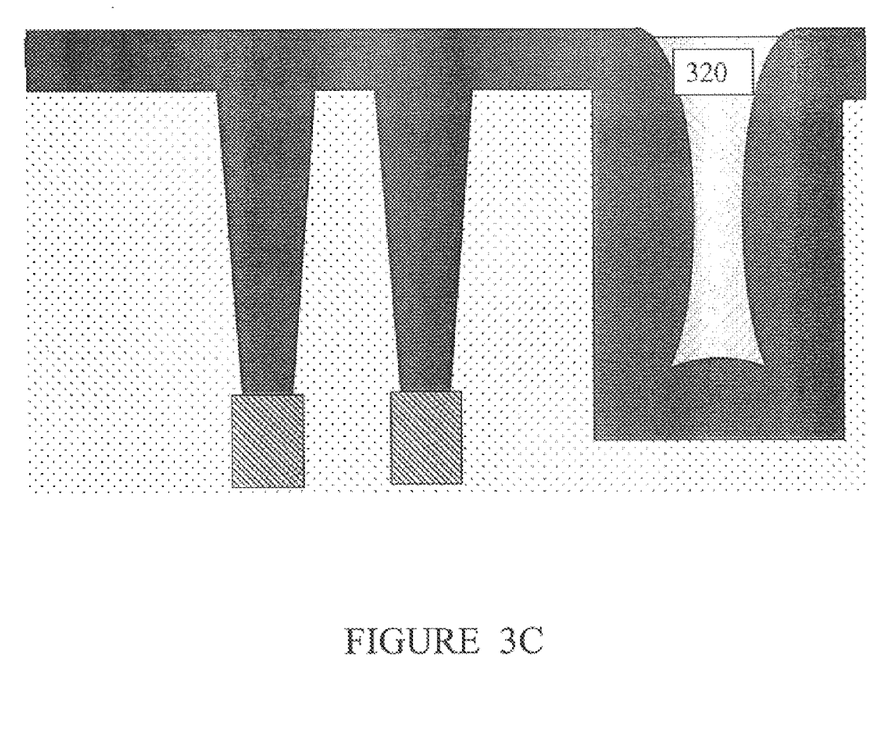
FIG. 3c illustrates etchback processing to remove any resist not filling the topography in accordance with a preferred embodiment.
Figure 3D:
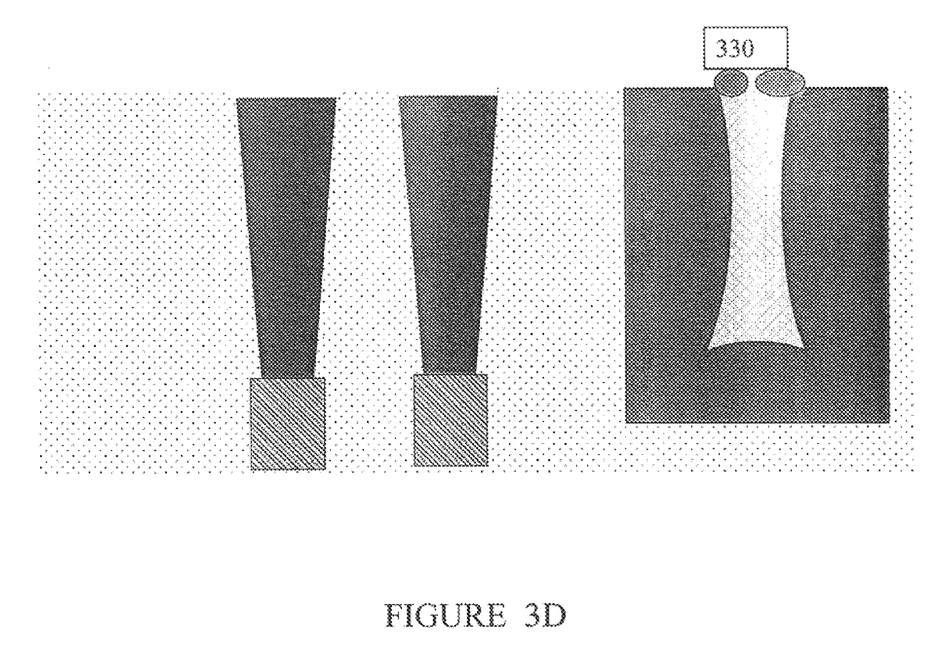
FIG. 3d illustrates wafer polishing in accordance with a preferred embodiment.
Figure 3E:
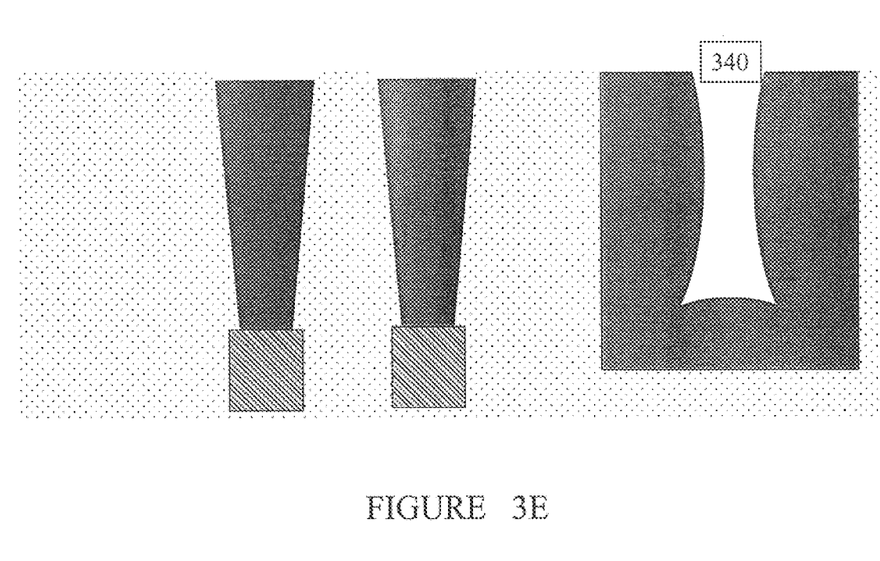
FIG. 3e illustrates a removal of the filling material by solvent in accordance with a preferred embodiment.

FIG. 3a illustrates a schematic of a semiconductor manufacture with tungsten coating the sides of the groves in accordance with a preferred embodiment. The grooves will accumulate particulate from any polishing absent a filling agent in accordance with a preferred embodiment. FIG. 3b illustrates a filling agent 310 such as novalac polymer coated on a wafer in accordance with a preferred embodiment. FIG. 3c illustrates an etchback process utilized to remove any resist 320 not filling the topography in accordance with a preferred embodiment. This processing is done to minimize the loading of the polish pad with the filling material. FIG. 3d illustrates the polishing process 330 in accordance with a preferred embodiment. Finally, FIG. 3e illustrates the removing of the sacrificial fill 340 by solvent or other means in accordance with a preferred embodiment.

While various embodiments have been described above, it should be understood that they have been presented by way of example only, and not limitation. Thus, the breadth and scope of a preferred embodiment should not be limited by any of the above described exemplary embodiments, but should be defined only in accordance with the following claims and their equivalents.

What is claimed is:

1. A method for semiconductor manufacture which prevents the accumulation of residue from polishing, comprising the steps of:
   (a) filling one or more gaps from the semiconductor manufacture with a sacrificial layer after deposition of a planarizing layer;
   (b) utilizing an etching technique to remove portions of the sacrificial layer not filling a gap on the semiconductor manufacture;
   (c) polishing the semiconductor; and
   (d) applying solvent to the sacrificial layer to remove the sacrificial layer from the semiconductor manufacture.

2. A method for semiconductor manufacture which prevents the accumulation of residue from polishing as recited in claim 1, wherein the etching technique is optimized for a particular substrate.

3. A method for removing a material formed on a layer of a semiconductor substrate as recited in claim 1, wherein the solvent comprises a mixture of basic and acidic components.

4. A method for semiconductor manufacture which prevents the accumulation of residue from polishing as recited in claim 3, wherein the basic component is selected from amines and hydroxides.

5. A method for semiconductor manufacture which prevents the accumulation of residue from polishing as recited in claim 3, wherein the acidic component is selected from the hydroxylammonium salts.

6. A method for semiconductor manufacture which prevents the accumulation of residue from polishing as recited in claim 1, wherein the sacrificial layer has little solvent resistance.

7. A method for semiconductor manufacture which prevents the accumulation of residue from polishing as recited in claim 1, wherein the sacrificial layer is a low viscosity novalac polymer.

8. A method for semiconductor manufacture which prevents the accumulation of residue from polishing, comprising the steps of:
   (a) filling one or more gaps from the semiconductor manufacture with a sacrificial layer, wherein the sacrificial layer has a slippery, glassy surface;
   (b) polishing the semiconductor; and
   (c) applying solvent to the sacrificial layer to remove the sacrificial layer from the semiconductor manufacture.

9. A method of semiconductor manufacture which prevents the accumulation of residue from polishing as recited in claim 8, wherein the etching technique is optimized for a particular substrate.

10. A method of semiconductor manufacture which prevents the accumulation of residue from polishing as recited in claim 8, wherein the solvent comprises a mixture of basic and acidic components.

11. A method of semiconductor manufacture which prevents the accumulation of residue from polishing as recited in claim 10, wherein the basic component is selected from amines and hydroxides.

12. A method of semiconductor manufacture which prevents the accumulation of residue from polishing as recited in claim 10, wherein the acidic component is selected from the hydroxylammonium salts.

13. A method of semiconductor manufacture which prevents the accumulation of residue from polishing as recited in claim 8, wherein the sacrificial layer has little solvent resistance.

14. A method of semiconductor manufacture which prevents the accumulation of residue from polishing as recited in claim 8, wherein the sacrificial layer is a low viscosity novalac polymer.

* * * * *